United States Patent [19]
Arai et al.

[11] Patent Number: 5,952,779
[45] Date of Patent: Sep. 14, 1999

[54] ORGANIC ELECTROLUMINESCENT LIGHT EMITTING DEVICE COMPRISING AN ANODE HAVING A LIGHT TRANSMITTANCE OF 30 TO 70

[75] Inventors: Michio Arai, Tokyo; Hiroshi Tanabe, Ibaraki, both of Japan

[73] Assignee: TDK Corporation, Tokyo, Japan

[21] Appl. No.: 08/980,274

[22] Filed: Nov. 28, 1997

[30] Foreign Application Priority Data

Nov. 27, 1996  [JP]  Japan ..................................... 8-331634

[51] Int. Cl.[6] ....................................................... H01J 1/62
[52] U.S. Cl. ............................................. 313/504; 313/503
[58] Field of Search .................... 313/502, 503, 313/504, 506, 509

[56] References Cited

U.S. PATENT DOCUMENTS 5,059,861 10/1991 Littman et al. .
5,104,746  4/1992 Sato et al. .............................. 313/504
5,200,668  4/1993 Ohashi et al. ......................... 313/504
5,314,775  5/1994 Ueda ........................................ 430/59

FOREIGN PATENT DOCUMENTS 0 838 976  4/1998  European Pat. Off. .
4-233194   8/1992  Japan .

OTHER PUBLICATIONS

Patent Abstracts of Japan, vol. 096, No. 011, Nov. 29, 1996, and JP 08 185979, Jul. 16, 1996.
Patent Abstracts of Japan, vol. 017, No. 180 (C–1046), Apr. 8, 1993, and JP 04 335087, Nov. 24, 1992.
Patent Abstracts of Japan, vol. 095, No. 11, Dec. 26, 1995, and JP 07 201467, Aug. 4, 1995.

*Primary Examiner*—Sandra O'Shea
*Assistant Examiner*—Joseph Williams
*Attorney, Agent, or Firm*—Oblon, Spivak, McClelland, Maier & Neustadt, P.C.

[57] ABSTRACT

An organic EL light emitting device with some contrast improvement is provided at low cost yet with no provision of an antireflection coating film. The device comprises a transparent substrate, and an anode, a light emitting layer and a cathode formed thereon in the described order. The anode contains indium oxide doped with tin and/or zinc, and iron in such a way as to have a light transmittance of 30 to 70% in a light emitting wavelength range.

3 Claims, 2 Drawing Sheets

ORGANIC ELECTROLUMINESCENT LIGHT EMITTING DEVICE COMPRISING AN ANODE HAVING A LIGHT TRANSMITTANCE OF 30 TO 70%

BACKGROUND OF THE INVENTION

The present invention relates generally to an organic electroluminescent light emitting device (which will hereinafter be often called an organic EL device for short), and more particularly to an anode for supplying positive holes to a light emitting layer.

In recent years, organic EL light emitting devices have been under intensive investigation. Referring to FIG. 3, there is illustrated one typical organic EL light emitting device. Basically, the device includes a glass substrate 21 and a transparent electrode or anode 22' of tin-doped indium oxide (ITO) or the like formed on the substrate 21. A thin film 23 serving as a hole transporting layer is formed on the anode 22' by evaporating a hole transporting material such as tetraphenyldiamine (TPD). A light emitting layer 24 of a fluorescent material such as an aluminum quinolinol complex ($Alq^3$) is deposited on the layer 23. An electrode or cathode 25 is formed thereon from a metal having a low work function such as magnesium. Such organic EL devices attract attentions because they can achieve a very high luminance ranging from 100 to 1,000 $cd/m^2$ with a drive voltage of approximately 10 volts.

A material capable of injecting more electrons into the light emitting layer is believed to be effective for the material used for a cathode of such an organic EL device. In other words, the lower the work function of a certain material, the more suitable is the material for the cathode. Various materials having a low work function are now available. Materials usable for the cathode of EL light emitting devices, for instance, include alloys such as MgAg, MgIn, etc., as disclosed in JP-A 4-233194, and combinations of an alkali metal and a metal having a high work function such as AlCa, AlLi, etc.

When an organic EL device has such structure as shown in FIG. 3, light emission is taken out of the anode 22' side because the cathode 25 side is opaque to light. In this regard, it is noted that the cathode 25 reflects light because of being formed of a metal, etc., as mentioned above. Consequently, a part of light coming from the light emitting layer, upon reflection at the cathode 25, leaves the anode 22' side in the form of a part of emergent light, thereby making a contribution to some luminance improvement.

The light reflected at the cathode 25, on the other hand, is so scattered that it leaves the anode 22' side at an angle of emergence different from that of another part of the light coming from the light emitting layer 24. When the organic EL device is used as a display or the like, the scattered light is diverted to a non-light emitting region or a light blocking region, resulting a contrast reduction. Especially when the device is used in a brightly illuminated environment or in the sunlight, extraneous sunlight or other intense light is converted at the device into reflected light, which causes a contrast reduction and, in turn, makes it very difficult to look at the display screen.

According to one possible approach to achieving contrast improvements, an antireflection coating film is provided on a side of a substrate on which no organic EL device is formed, thereby preventing contrast reductions. However, the addition of such an extra antireflection coating film leads to increases in the number of production steps and parts and, hence, increases in the cost of the organic EL device.

SUMMARY OF THE INVENTION

An object of the present invention is to provide an inexpensive organic EL light emitting device which prevents contrast reductions without provision of any extra antireflection coating film.

Such an object is accomplished by the inventions defined below as (1) to (4).

(1) An organic EL light emitting device comprising a transparent substrate, and an anode, a light emitting layer and a cathode formed thereon in the described order, said anode having a light transmittance of 30 to 70% in a light emitting wavelength range.

(2) The organic EL light emitting device of (1), wherein said anode contains an indium oxide doped with tin and/or zinc, and iron.

(3) The organic EL light emitting device of (1), wherein said anode contains an indium oxide doped with an oxygen depletion type tin and/or zinc.

(4) The organic EL light emitting device of any one of (1) to (3), which further comprises a transparent electrode between said anode and said substrate.

BRIEF DESCRIPTION OF THE DRAWINGS

The above and other objects, features, and advantages of the present invention will be better understood from the following description in conjunction with the accompanying drawings, in which.

DETAILED EXPLANATION OF THE INVENTION

Figure 1:
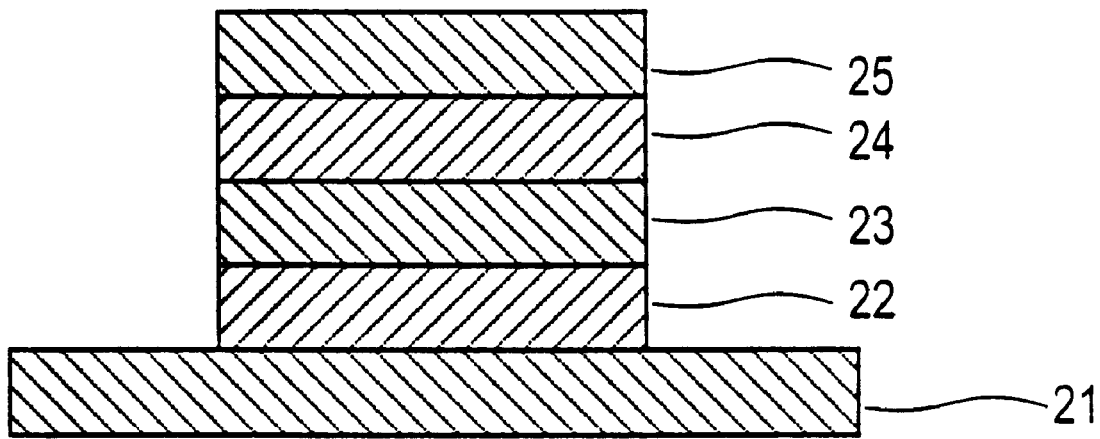
FIG. 1 is a schematic view of one embodiment of the organic EL device according to the present invention.

Some preferred embodiments of the present invention will now be explained more specifically.

In the organic EL light emitting device of the present invention, an anode, a light emitting layer and a cathode are formed on a transparent substrate in the described order, with the anode having a light transmittance of 30 to 70% in a light emitting wavelength region.

A semitransparent anode is composed mainly of transparent materials such as tin-doped indium oxide (ITO), zinc-doped indium oxide (IZO), and tin-zinc-doped indium oxide (ITZO). In the practice of the present invention, particular preference is given to ITO or IZO, of which ITO is most preferred because it has a high affinity for a dopant or coloring component and its light transmittance is readily adjustable. The semitransparent anode has a light transmittance lying in the range of 30 to 70%, and preferably 40 to 60%. A semitransparent anode having a light transmittance exceeding 70% is ineffective for preventing contrast reductions. A semitransparent anode having a light transmittance of less than 30% cannot provide a light emitting device having the required luminance because the light emitted from an emitting layer is susceptible to attenuation. By the term "light transmittance" used herein is intended the ratio between incident light and emergent light in a wavelength range of at least 100 nm inclusive of the light emitting wavelength region, and particularly at a wavelength range of 400 to 700 nm; by the term "luminance" is usually intended a luminance measured as by a luminancemeter made by Topcon Co., Ltd., and by the term "contrast" is intended the luminance ratio between a light emitting portion and a non-light emitting portion, as determined by such a luminancemeter.

By allowing the light transmittance to be in the aforesaid range, it is not necessary to provide a black film called a black matrix to make the color of the color filter less visible.

For the semitransparent anode, it is preferable to use (1) one of the aforesaid transparent materials doped with a coloring component, and (2) an oxygen-depletion material obtained by ridding one of the aforesaid transparent materials of oxygen.

(1) The coloring component to be doped on the substrate is iron or Fe. The iron oxide formed after doping may be either FeO or $Fe_2O_3$. To obtain a semitransparent anode having a light transmittance lying in the aforesaid range, it is preferable that, for instance, the transparent ITO or IZO material contains FeO or $Fe_2O_3$ in an amount of 1 to 15% by weight calculated as Fe. Of these materials, the transparent ITO material contains $In_2O_3$ and $SnO_2$ usually in a stoichiometric composition although the amount of oxygen may deviate more or less from stoichiometry. When ITO is represented by $InO_X \cdot SnO_Y$, it is desired that X be in the range of 1.0 to 2.0 and Y be in the range of 1.5 to 2.5. In another parlance, the mixing ratio of $SnO_2$ with respect to $In_2O_3$ is preferably 1 to 20 wt %, and more preferably 5 to 12 wt %. IZO contains $In_2O_3$ and ZnO usually in a stoichiometric composition although the amount of oxygen may deviate slightly from stoichiometry. When IZO has a formula $InO_Z \cdot ZnO_V$, it is desired that Z be in the range of 1.0 to 2.0 and V be in the range of 0.8 to 1.2. In another parlance, the mixing ratio of ZnO with respect to $In_2O_3$ is in the range of preferably 12 to 32 wt %. It is acceptable that ITO, and IZO may contain other elements such as Sn, Ti, and Pb in an oxide form and in an amount of less than 1 mol % calculated as oxides. Of course, use may also be made of a mixture of ITO and IZO at any desired proportion.

(2) When the oxygen-depletion type transparent material is used to form a semitransparent anode having a light transmittance in the aforesaid range, it is preferable that a transparent ITO or IZO material has a tin/indium or zinc/indium ratio of 0.5 to 2, and that ITO or IZO is doped with a 1 to 20% by weight excess of at least one of In, Sn, and Zn.

Such a semitransparent anode may have at least a thickness large enough to achieve sufficient charge injection, preferably in the range of 50 to 500 nm, and more preferably in the range of 50 to 300 nm. Although there is no upper limit to anode thickness, too thick an anode has the risk of delamination. Too thin an anode, on the other hand, offers problems in connection with film strength during manufacture, and the ability to transport electrons.

This semitransparent anode layer is preferably formed by a sputtering technique although it may be formed by evaporation, etc.

For the semitransparent anode, especially the oxygen-depletion type semitransparent anode, it is acceptable that a transparent electrode layer is formed on a side thereof that is not opposite to the light emitting layer.

Such a transparent electrode may be made up of any one of the aforesaid transparent materials such as ITO, IZO, etc. This transparent electrode may have at least a thickness large enough to achieve sufficient charge injection, preferably in the range of 50 to 500 nm, and more preferably in the range of 50 to 300 nm. Although there is no upper limit to electrode thickness, too thick an electrode has the risk of delamination. Too thin an electrode, on the other hand, offers problems in connection with film strength during manufacture, and the ability to transport electrons. Although this transparent electrode may be formed as by evaporation, it is preferable to make use of a sputtering technique which enables the transparent electrode to be formed subsequently to the formation of the semitransparent anode, etc. It is noted that such a multilayer type anode, too, has a light transmittance lying in the range of 30 to 70%.

The multilayer type anode made up of the semitransparent anode and transparent electrode layers has a total thickness of at least 50 nm, and preferably at least 100 nm. The upper limit to the total thickness, albeit being not critical to the practice of the present invention, may be up to 1,000 $\mu$m, and preferably up to 100 $\mu$m.

When the semitransparent anode and transparent electrode are formed by sputtering, it is preferable to make use of DC sputtering or RF sputtering employing a target comprising $In_2O_3$ doped with SnO or ZnO, and optionally with Fe. A cathode formed by sputtering is lesser susceptible to a luminance change with time than that formed by evaporation. At this time, a power lying in the range of 0.1 to 4 $W/cm^2$ is preferably supplied.

While the sputtering gas is not critical to the practice of the present invention, it is preferable to use inert gases such as Ar, He, Ne, Kr, and Xe or mixtures thereof. During sputtering, the sputtering gas may usually have a pressure of about 0.1 to 20 Pa.

To dope the transparent electrode with iron oxide, ITO or IZO having Fe, FeO, $Fe_2O_3$, etc. incorporated therein is used as the target. The proportion of the dopants to be incorporated is preferably 0.3 to 30% by weight for Fe, and 0.3 to 30% by weight for FeO.

Figure 2:
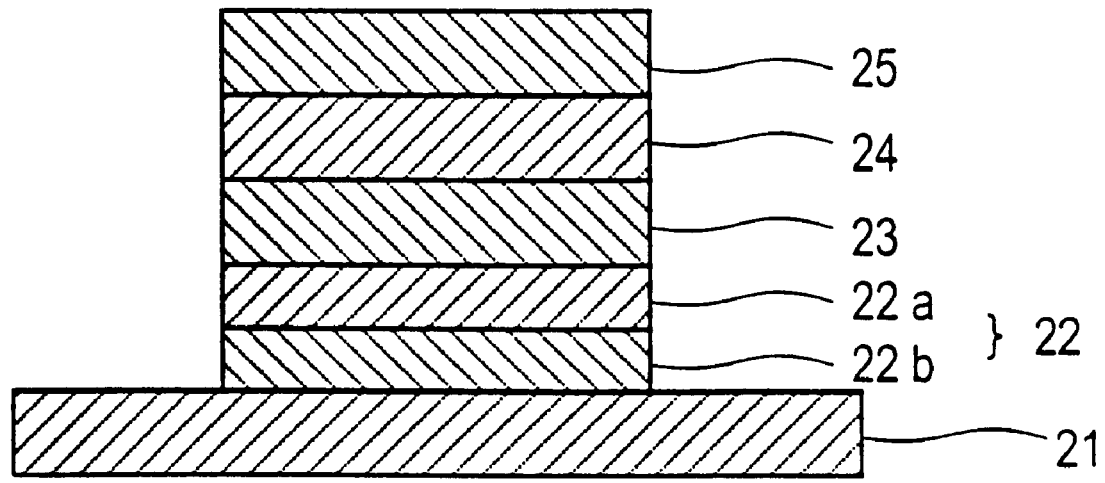
FIG. 2 is a schematic view of another embodiment of the organic EL device according to the present invention.
Figure 3:
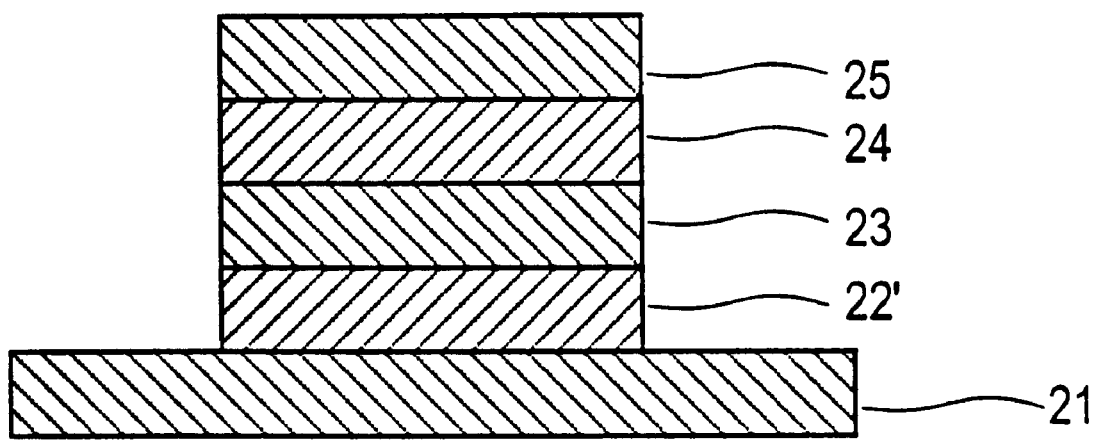
FIG. 3 is a schematic view of one construction of a conventional organic EL device.

First, and second embodiments of the organic EL device according to the present invention are shown in FIGS. 1, and 2, respectively. The EL device depicted in FIG. 1 comprises an anode 22 functioning as the semitransparent anode, a hole injecting and transporting layer 23, a light emitting and electron injecting/transporting layer 24 and a cathode 25 formed on a substrate 21 in the described order. In the organic EL device depicted in FIG. 2, an anode 22 is made up of a semitransparent anode 22a and a transparent electrode 22b.

The EL device of the present invention is not limited to the illustrated embodiments, and so may have various other architectures. For instance, an electron injecting and transporting layer may be interleaved between the light emitting layer and the cathode.

The cathode may be formed by evaporation or sputtering, the organic layers represented by the light emitting layer may be formed by vacuum evaporation or the like, and the anode may be formed by the aforesaid technique. If necessary, these layers can be patterned, for instance, by mask evaporation or film formation followed by etching whereby a desired light emitting pattern is accomplished. If the substrate bears a thin film transistor (TFT), the respective layers may be formed in accordance with the pattern of TFT to accomplish a display or drive pattern immediately. Finally, a protective layer is formed over the device using inorganic materials such as SiOx and organic materials such as Teflon.

To achieve effective electron injection, the cathode is preferably made up of a material having a low work function, for instance, any one of metal elements such as K, Li, Na, Mg, La, Ce, Ca, Sr, Ba, Al, Ag, In, Sn, Zn, and Zr. To improve the stability of the cathode, it is preferably made up of a binary or ternary alloy system comprising two or three of the aforesaid metal elements. Preferable for such an alloy system, for instance, are Ag.Mg (Ag: 1 to 20 at %), Al.Li (Li: 0.1 to 20 at %), In.Mg (Mg: 50 to 80 at %), and Al.Ca (Ca: 5 to 20 at %).

The cathode thin film may have at least a thickness large enough to achieve satisfactory electron injection, for instance, of at least 50 nm, and preferably at least 100 nm. While there is no upper limit to film thickness, a film thickness of about 100 to 500 nm is usually preferred.

The protective layer may be either transparent or opaque. To make the protective layer transparent, it is preferable to make a selection from transparent materials (e.g., $SiO_2$, and SIALON), or alternatively perform thickness control (in such a manner that at least 80% of emitted light can transmit through the protective layer). In general, the protective layer may have a thickness of about 50 to 1,200 nm. Although no particular limitation is placed on how to form the protective layer, that is, the protective layer may be formed as by evaporation, it is preferable to make use of sputtering which enables the protective layer to be formed subsequently to the formation of the cathode.

Here the organic layer provided in the EL device of the present invention is explained.

The light emitting layer has functions of injecting holes and electrons, transporting them, and recombining holes and electrons to create excitons. It is preferable that relatively electronically neutral compounds are used for the light emitting layer.

The charge transporting layer, which is sometimes referred to as a hole injecting and transporting layer, has functions of facilitating injection of holes from the anode, transporting holes, and blocking electron transportation.

For example, when the compound used in the light emitting layer has a relatively low electron injecting and transporting function, an electron injecting and transporting layer having functions of facilitating injection of electrons from the cathode, transporting electrons, and blocking hole transportation may be provided between the light emitting layer and the cathode, if necessary, as previously described.

The hole, and electron injecting and transporting layers are effective for increasing the number of holes and electrons injected into the light emitting layer and confining holes and electrons therein for optimizing the recombination region to improve light emission efficiency.

Each of the hole and electron injecting and transporting layers may be constructed in the form of a double-layered structure consisting separately of a layer having an injecting function and a layer having a transporting function.

The thickness of the light emitting layer, the hole injecting and transporting layer, and the electron injecting and transporting layer is not critical to the practice of the present invention, and so varies with their particular formation techniques. However, a thickness of about 5 to 100 nm, especially about 10 to 100 nm is usually preferable.

The thickness of the hole injecting and transporting layer, and the electron injecting and transporting layer is equal to, or ranges from about 1/10 times to about 10 times, the thickness of the light emitting layer although it depends on the design of the recombination/light emitting region. When the electron or hole injecting and transporting layer is separated into an injecting layer and a transporting layer, it is preferable that the injecting layer is at least 1 nm thick and the transporting layer is at least 20 nm thick. The upper limit to thickness is usually about 100 nm for the injecting layer and about 100 nm for the transporting layer. The same film thickness applies when two injecting and transporting layers are provided.

By controlling the layer thickness while taking into account the carrier mobility and carrier density (depending on ionization potential and electron affinity) of the light emitting layer, the hole injecting and transporting layer, and the electron injecting and transporting layer to be combined, the free design of the recombination/light emitting region, the design of emission color, the control of the luminance and spectrum of light emission by the interference of both the electrodes, and the control of the spatial distribution of light emission become feasible.

In the organic EL device according to the present invention, the light emitting layer contains a fluorescent material that is a compound capable of emitting light. The fluorescent material may be selected from metal complex dyes such as tris(8-quinolinolato)aluminum as disclosed in JP-A 63-264692, for instance. Additionally, quinacridone, coumarin, rubrene, and styryl dyes, tetraphenylbutadiene, anthracene, perylene, coronene, and 12-phthaloperinone derivatives may be used alone or in admixture with the metal complex dye. In the embodiment wherein the light emitting layer also serves as an electron injecting and transporting layer, the use of tris(8-quinolinolato)aluminum is preferred. These fluorescent materials may be evaporated or otherwise deposited.

For the electron injecting and transporting layer which is provided if necessary, there may be used organic metal complexes such as tris(8-quinolinolato)aluminum, oxadiazole derivatives, perylene derivatives, pyridine derivatives, pyrimidine derivatives, quinoline derivatives, quinoxaline derivative, diphenylquinone derivatives, and nitro-substituted fluorene derivatives. The electron injecting and transporting layer may also serve as a light emitting layer as previously mentioned. In this case, it is preferable to use tris(8-quinolinolato)aluminum, etc. Like the light emitting layer, the electron injecting and transporting layer may be formed by evaporation or the like.

Where the electron injecting and transporting layer is a double-layered structure comprising an electron injecting layer and an electron transporting layer, two or more compounds are selected in a proper combination from the compounds commonly used for electron injecting and transporting layers. In this regard, it is preferred to laminate layers in such an order that a compound layer having a greater electron affinity is disposed contiguous to the cathode. This order of lamination also applies where a plurality of electron injecting and transporting layers are provided.

For the hole injecting and transporting layer, there may be used various organic compounds as disclosed in JP-A's 63-295695, 2-191694, 3-792, 5-234681, 5-239455, 5-299174, 7-126225, 7-126226 and 8-100172 and EP 0650955A1. Examples are tetraarylbenzidine compounds (tetraaryldiamine or tetraphenyldiamine (TPD)), aromatic tertiary amines, hydrazone derivatives, carbozole derivatives, triazole derivatives, imidazole derivatives, oxadiazole derivatives having an amino group, and polythiophenes. Where these compounds are used in combination of two or more, they may be stacked as separate layers, or otherwise mixed.

Where the hole injecting and transporting layer is a double-layered structure comprising a hole injecting layer and a hole transporting layer, two or more compounds are selected in a proper combination from the compounds commonly used for hole injecting and transporting layer. In this regard, it is preferred to laminate layers in such an order that a compound layer having a lower ionization potential is disposed contiguous to the anode (ITO, etc.). It is also preferred to use a compound having good thin film forming ability at the anode surface. Such an order of lamination is effective for lowering drive voltage and preventing the occurrence of current leakage and the appearance and growth of dark spots. Since evaporation is utilized in the manufacture of devices, films as thin as about 1 to 10 nm can be formed in a uniform and pinhole-free state, which restrains any change in color tone of light emission and a drop of efficiency by re-absorption even if a compound having a low inonization potential and absorption in the visible range is used in the hole injecting layer.

Like the light emitting layer and so on, the hole injecting and transporting layer may be formed by evaporating the aforesaid compounds.

For the transparent electrode used as the anode in the practice of the present invention, the type and thickness of an anode-forming material are preferably determined such that at least 80% of emitted light transmits therethrough. For example, tin-doped indium oxide (ITO), zinc-doped indium oxide (IZO), $SnO_2$, and polypyrrole doped with a dopant may be used as the anode. The anode has preferably a thickness of about 10 to 500 nm. The drive voltage should preferably be low enough to improve the reliability of the device.

For the substrate material, transparent or translucent materials such as glass, quartz and resins are used when emitted light is taken out of the substrate side. The substrate may be provided with a color filter film, fluorescent material-containing color conversion film or dielectric reflecting film for controlling the color of light emission.

In a preferred light emitting device embodiment, the semitransparent electrode or the transparent electrode and semitransparent electrode are formed on the substrate. Then, the light emitting material such as an aluminum quinolinol complex and the cathode are stacked on the semitransparent electrode. Finally, an $SiO_2$ film or the like is sputtered to form the protective layer. Since the anode and antireflection coating film are formed as an integral unit and so the number of production steps and parts is reduced, this organic EL device can be provided at low cost. It is here noted that when the semitransparent anode having a limited light transmittance is used for the anode, the light emitted from the light emitting layer is susceptible to attenuation. Since extraneous incident light passes twice through the semitransparent anode, however, a luminance difference between the emitted light and the reflected light is so large that contrast improvements are achievable.

The organic EL device of the present invention is generally of the DC drive type while it may be of the AC or pulse drive type. The applied voltage is generally about 5 to 20 volts.

EXAMPLE

The present invention are explained more specifically with reference to some examples, and comparative examples.

Example 1
Preparation of Semitransparent Anode

A semitransparent anode of 100 nm in thickness was formed on a glass substrate by DC sputtering.

The target used was $In_2O_3$ having $SnO_2$ (10 mol %) and $Fe_2O_3$ (5% by weight) incorporated therein, the sputtering gas used was Ar, and the gas pressure applied was 1 Pa. The temperature and power applied were 80° C. and 1 W/cm$^2$, respectively, with a spacing of 8 cm between the substrate and the target. The anode film was composed mainly of $In_2O_3$ with an $SnO_2$ content of 10 mol % and an Fe content of 5% by weight. The anode was found to have a light transmittance of about 50% at 400 to 700 nm wavelengths.

Preparation of Organic EL Device

The semitransparent anode was ultrasonically washed with neutral detergent, acetone, and ethanol, and then pulled up from boiling ethanol, followed by drying. The semitransparent anode was cleaned on its surface with $UV/O_3$. Subsequently, the anode was fixed to a substrate holder in a vacuum evaporation apparatus, which was evacuated to a vacuum of $1\times10^{-4}$ Pa or lower.

With the vacuum kept, N,N'-diphenyl-N,N'-m-tolyl-4,4'-diamino-1,1'-biphenyl (TPD) was evaporated on the anode at a deposition rate of 0.2 nm/sec. to a thickness of 55 nm to form a hole injecting and transporting layer.

With the vacuum kept, Alq$^3$ or tris(8-quinolinolato) aluminum was evaporated at a deposition rate of 0.2 nm/sec. to a thickness of 50 nm to form an electron injecting/transporting and light emitting layer.

Then, the anode was transferred from the vacuum evaporation apparatus to a sputtering apparatus wherein an Ag.Mg target was used to form a cathode at a rate of 10 nm/min. to a thickness of 150 nm by means of DC sputtering. The sputtering gas, gas pressure, and power applied were Ar, 1 Pa, and 100 W, respectively, with a spacing of 8 cm between the substrate and the target.

Finally, $SiO_2$ was sputtered to a thickness of 200 nm to form a protective layer, thereby obtaining an organic thin film light emitting device (EL device).

A DC voltage was applied across the organic thin film light emitting device to continuously drive the device at a constant current density of 10 mA/cm$^2$. At the initial, the device when driven at 8.5 volts was found to emit green light at a luminance of 200 cd/m$^2$ (light emission maximum wavelength λ.max=520 nm). The half-life of luminance was 500 hours, with a drive voltage increase of 1 volt. Neither appearance nor growth of dark spots was observed. The device continued stable light emission without current leakage during the subsequent operation.

Example 2

An organic EL device was obtained as in Example 1 with the exception that an oxygen-depletion type semitransparent anode was prepared as the anode, as mentioned just below.

The target used was $In_2O_3$ having $SnO_2$ (10 mol %) incorporated therein, the sputtering gases used were Ar at a flow rate of 50 sccm and $H_2$ at a flow rate of 5 sccm, the sputtering temperature applied was 100° C., the input power applied was 1 W/cm$^2$, and the spacing between the substrate and the target was 8 cm. The anode film was composed of $In_2O_3$ +$SnO_2$ (10 mol %), and found to contain a 7% by weight excess of In.Sn. The anode was then found to have a light transmittance of about 50% at 400 to 700 nm wavelengths.

Example 3

In Examples 1 and 2, IZO (containing 35 mol % of ZnO) was used in place of ITO. Virtually similar results were obtained.

According to the present invention, an inexpensive organic EL device with some contrast improvement can be achieved without recourse to any special antireflection coating film.

Although some preferred embodiments have been described, many modifications and variations may be made thereto in the light of the above teachings. It is therefore to be understood that within the scope of the appended claims, the invention may be practiced otherwise than as specifically described.

What is claimed is:

1. An organic electroluminescent light emitting device comprising a transparent substrate, and an anode, a light emitting layer and a cathode formed thereon in the described order, wherein:

said anode comprises indium oxide doped with an oxygen depletion type tin, zinc or tin and zinc, said anode having a light transmittance of 30 to 70% in a light emitting wavelength range.

2. The organic electroluminescent light emitting device of claim 1. wherein said anode is further doped with iron.

3. The organic electroluminescent light emitting device of claim 1, which further comprises a transparent electrode between said anode and said substrate.

* * * * *

UNITED STATES PATENT AND TRADEMARK OFFICE
CERTIFICATE OF CORRECTION

PATENT NO. : 5,952,779

DATED : September 14, 1999

INVENTOR(S): Michio ARAI, et al

It is certified that an error appears in the above-identified patent and that said Letters Patent is hereby corrected as shown below:

On the title page, item [54], the title should be:

--[54] ORGANIC ELECTROLUMINESCENT LIGHT
       EMITTING DEVICE COMPRISING AN ANODE
       HAVING A LIGHT TRANSMITTANCE OF 30 TO 70%--

Signed and Sealed this

First Day of August, 2000

*Attest:*

Q. TODD DICKINSON

*Attesting Officer*　　　*Director of Patents and Trademarks*